US011519097B1

United States Patent
Liu et al.

(10) Patent No.: US 11,519,097 B1
(45) Date of Patent: Dec. 6, 2022

(54) STRAINED DIAMOND GROWING AND DOPING METHOD BASED ON CHEMICAL VAPOR DEPOSITION (CVD) METHOD

(71) Applicant: WUHAN UNIVERSITY, Hubei (CN)

(72) Inventors: Sheng Liu, Hubei (CN); Wei Shen, Hubei (CN); Gai Wu, Hubei (CN); Yuzheng Guo, Hubei (CN); Kang Liang, Hubei (CN); Qijun Wang, Hubei (CN); Shizhao Wang, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 0 days.

(21) Appl. No.: 17/849,761

(22) Filed: Jun. 27, 2022

(30) Foreign Application Priority Data

Jan. 5, 2022 (CN) .......................... 202210003968.4

(51) Int. Cl.
*C30B 25/18* (2006.01)
*C30B 29/04* (2006.01)

(52) U.S. Cl.
CPC .............. *C30B 29/04* (2013.01); *C30B 25/18* (2013.01)

(58) Field of Classification Search
CPC ......... C30B 25/00; C30B 25/02; C30B 25/16; C30B 25/165; C30B 25/18; C30B 25/183; C30B 25/20; C30B 29/00; C30B 29/02; C30B 29/04; C30B 29/06; C30B 29/08
USPC ...... 117/84, 88–89, 105, 928–929, 935–936, 117/939
See application file for complete search history.

(56) References Cited

U.S. PATENT DOCUMENTS

| 6,893,936 B1 * | 5/2005 | Chen ................. H01L 21/76254 438/456 |
| 2002/0160584 A1 | 10/2002 | Kanzawa et al. |
| 2002/0182423 A1 * | 12/2002 | Chu ....................... C23C 16/32 428/641 |
| 2017/0213820 A1 | 7/2017 | Balakrishnan et al. |

FOREIGN PATENT DOCUMENTS

| CN | 1364309 | 8/2002 |
| CN | 1723545 | 1/2006 |
| CN | 1954421 | 4/2007 |
| CN | 102162137 | 8/2011 |
| CN | 108545738 | 9/2018 |
| CN | 111051257 | 4/2020 |
| CN | 112142464 | 12/2020 |

(Continued)

*Primary Examiner* — Kenneth A Bratland, Jr.
(74) *Attorney, Agent, or Firm* — JCIP Global Inc.

(57) ABSTRACT

The present disclosure relates to a method for growing and doping a strained diamond based on a chemical vapor deposition (CVD) method. The method comprises: depositing a gradient buffer layer and a relaxation layer on a substrate layer in sequence by the CVD method; and finally, depositing a CVD strained diamond layer on the relaxation layer and performing doping by the CVD method. According to the method, a lattice constant of the relaxation layer prepared by utilizing the CVD method is greater than a lattice constant of the diamond, so that a diamond generates a stretching strain. In growing and doping processes, the CVD strained diamond is in a stretching strain state. Therefore, a formation energy of a doped element is low, and it is easy to dope the diamond, so that a doping concentration of the diamond is high.

10 Claims, 2 Drawing Sheets

(56) References Cited

FOREIGN PATENT DOCUMENTS

| | | |
|---|---|---|
| CN | 113096749 | 7/2021 |
| WO | 2004064130 | 7/2004 |
| WO | 2006011912 | 2/2006 |
| WO | 2019051299 | 3/2019 |

* cited by examiner

STRAINED DIAMOND GROWING AND DOPING METHOD BASED ON CHEMICAL VAPOR DEPOSITION (CVD) METHOD

CROSS-REFERENCE TO RELATED APPLICATION

This application claims the priority benefit of China application serial no. 202210003968.4, filed on Jan. 5, 2022. The entirety of the above-mentioned patent application is hereby incorporated by reference herein and made a part of this specification.

TECHNICAL FIELD

The present disclosure belongs to the technical field of diamond semiconductors, and relates to a vapor deposition process, particularly relates to a method for growing and doping a strained diamond based on a chemical vapor deposition (CVD) method.

BACKGROUND

As a colorless transparent material, diamond is composed of carbon atoms of face-centered cubic structures. Carbon atoms are connected via $sp^3$ covalent bonds. Due to the face-centered cubic structures and the $sp^3$ covalent bonds, diamond features high hardness, high thermal stability and high chemical stability. Pure diamond is an insulator with a resistivity reaching up to $10^{13}$-$10^{16}$ $\Omega \cdot m$. At a temperature of 300K, a band gap of the diamond reaches 5.47 eV and an electron mobility reaches 4500 $cm^2 \cdot V^{-1} \cdot s^{-1}$. By doping elements such as nitrogen or boron, the diamond may have performance of an n-type semiconductor or a p-type semiconductor. As a third generation semiconductor, diamond is also referred to as an ultimate semiconductor, while remaining its n-type doping a worldwide problem.

Diamond can be doped with boron by CVD method, to achieve p-type diamond. An n-type doping problem of diamond has not been settled well. At present, n-type doping of diamond is mainly realized by doping phosphorus. However, n-type phosphorus-doped diamond has high resistivity and low electron mobility mainly because of low-concentration of doped phosphorus and high-concentration of doping defect. The lattice constant of diamond is small (about 3.57 Å), so that the formation energy of phosphorus doping in diamond is high, which is a major reason of a low concentration of doped phosphorus. In addition, many scholars have proposed an n-type co-doped diamond. Although the ionization energy of the co-doped diamond is low relative to the phosphorus-doped diamond, it is still subject to the high formation energy of a co-doping structure, so that it is difficult to achieve co-doped diamond in an actual CVD process. Other single-doped elements such as oxygen, sulfur and arsenic have high formation energy, which restrains electrical performance of the n-type diamond.

SUMMARY

To solve the doping problem of diamond, the present disclosure provides a method for growing and doping a strained diamond based on a chemical vapor deposition (CVD) method. The method is used for growing and doping the diamond while applying a strain to the diamond. The doping concentration and the electrical performance of the diamond are improved.

In order to solve the above-mentioned technical problems, the present disclosure provides a method for growing and doping a strained diamond based on a chemical vapor deposition (CVD) method, including the following steps:

Step 1: performing preparatory work of a substrate layer: placing the substrate layer on a sample stage of a CVD device;

Step 2: growing an $X_aC_{1-a}$ gradient buffer layer by CVD: introducing a mixed gas of a gas containing an element X, a methane gas and hydrogen to prepare the $X_aC_{1-a}$ gradient buffer layer, wherein a is the proportion of the element X in $X_aC_{1-a}$;

Step 3: growing an $X_bC_{1-b}$ relaxation layer by CVD: introducing a mixed gas of a gas containing an element X, a methane gas and hydrogen, and fixing a flow of the gas containing the element X to make a component X of the $X_bC_{1-b}$ relaxation layer be kept constant in a perpendicular direction so as to prepare the $X_bC_{1-b}$ relaxation layer, wherein b is a proportion of the element X in $X_bC_{1-b}$, X is a lattice constant adjusting element, and C is an element carbon;

Step 4: growing and doping a CVD strained diamond layer by CVD: introducing a mixed gas containing a doping gas, a methane gas and hydrogen to make the diamond be doped while growing so as to grow the CVD strained diamond layer on the $X_bC_{1-b}$ relaxation layer, wherein a lattice constant of the $X_bC_{1-b}$ relaxation layer is greater than a diamond lattice constant of the CVD strained diamond layer, so that the CVD strained diamond layer is in a stretching strain state; and Step 5: stripping the substrate layer to obtain a diamond-doped epitaxial structure.

In addition, the substrate layer, the $X_aC_{1-a}$ gradient buffer layer and the $X_bC_{1-b}$ relaxation layer can be removed by an etching process to obtain a strainless doped diamond as required.

The principle of the present disclosure is as follows:

The lattice constant of the single crystal material of the $X_bC_{1-b}$ relaxation layer is greater than the diamond lattice constant of the CVD strained diamond layer. When the single crystal material of the $X_bC_{1-b}$ relaxation layer is matched with the lattice constant of the CVD strained diamond layer, the CVD strained diamond layer will be subjected to a stretching strain so as to generate biaxial stretching strains in an X direction and a Y direction, so that atoms of the diamond stretch under the action of the stretching strain, and doping atoms enter the diamond conveniently. Therefore, the doping concentration and the electrical performance of the diamond are improved, and resistivity is reduced.

As a technical solution of a preferred embodiment, a thickness of the $X_aC_{1-a}$ gradient buffer layer is greater than a thickness of the $X_bC_{1-b}$ relaxation layer, and the thickness of the $X_bC_{1-b}$ relaxation layer is greater than a thickness of the CVD strained diamond layer, thereby a stretching strain state of the diamond layer is maintained.

A diamond model of 64 atoms is constructed by simulation, and based on the first-principles calculations, the formation energy for phosphorus doping under each strain condition is calculated. Under a condition that the diamond is strainless, the formation energy of the phosphorus atom is 6.786 eV; when the biaxial stretching strain of the diamond is 4%, the formation energy of the phosphorus atom is 5.827 eV; and when the biaxial stretching strain of the diamond is 8%, the formation energy of the phosphorus atom is 4.842 eV. Thus, it is proved that the biaxial strain helps to reduce the doping formation energy so as to further improve the doping concentration.

The present disclosure has the following advantages:

in growing and doping processes, the CVD strained diamond is in a stretching strain state. Therefore, a formation energy of a doped element is low, and it is easy to dope the diamond with the n-type dopant, so that a doping concentration of the diamond is high, and the resistivity is further reduced.

DETAILED DESCRIPTION

The following further describes the present disclosure in detail with reference to the accompanying drawings and specific embodiments.

Figure 1:
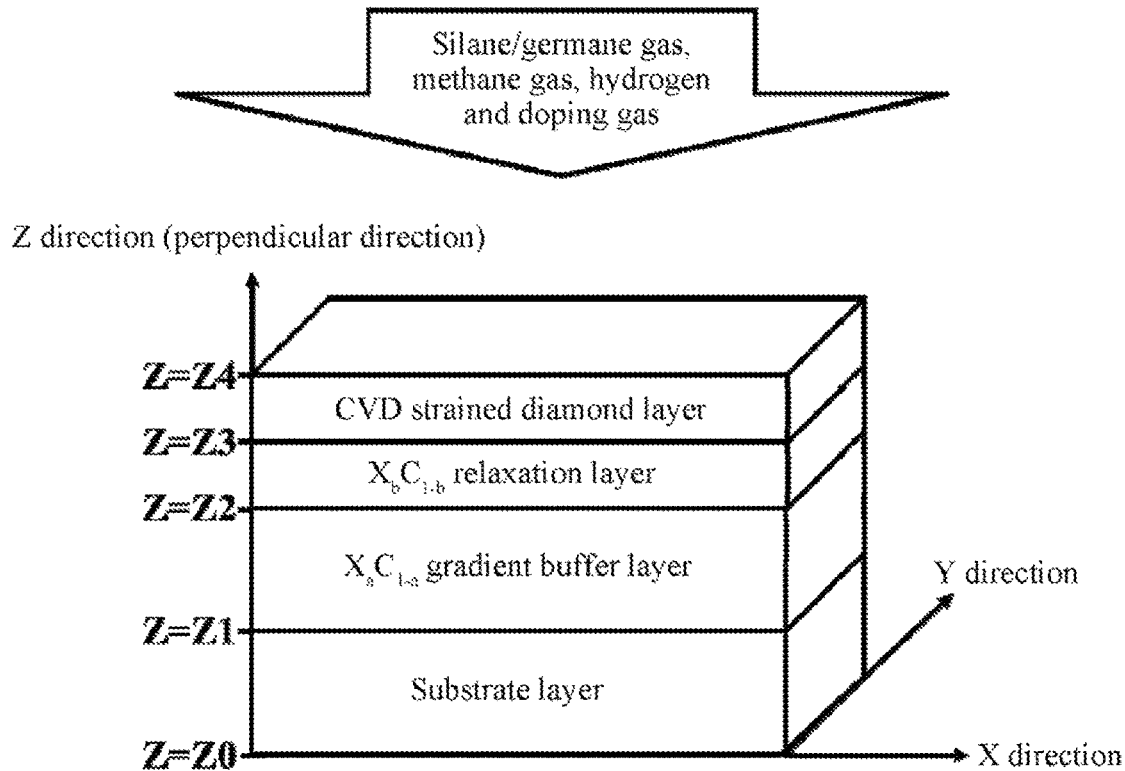
FIG. 1 is a structural schematic diagram of growing and doping strained diamond based on a CVD method.

As shown in FIG. 1, the present disclosure provides a strained diamond growing and doping epitaxial structure based on a CVD method. An $X_aC_{1-a}$ gradient layer and an $X_bC_{1-b}$ relaxation layer are deposited on a substrate layer in sequence from bottom to top in a perpendicular direction by the CVD method, and finally, a CVD strained diamond layer is deposited on the $X_bC_{1-b}$ relaxation layer.

As shown in FIG. 1, a perpendicular thickness of a material of the substrate layer is between Z=Z0 and Z=Z1.

As shown in FIG. 1, a perpendicular thickness of the $X_aC_{1-a}$ gradient buffer layer is between Z=Z1 and Z=Z2.

As shown in FIG. 1, a perpendicular thickness of the $X_bC_{1-b}$ relaxation layer is between Z=Z2 and Z=Z3.

As shown in FIG. 1, a perpendicular thickness of the CVD strained diamond layer is between Z=Z3 and Z=Z4.

The material of the substrate is a silicon single crystal material or a diamond single crystal material or a silicon carbide single crystal material.

A material of the $X_aC_{1-a}$ gradient buffer layer is an $X_aC_{1-a}$ crystal material.

The $X_aC_{1-a}$ material is a crystal material with a proportion of the element X being a/1 and the element C being (1-a)/1.

A material of the $X_bC_{1-b}$ relaxation layer is an $X_bC_{1-b}$ single crystal material.

The $X_bC_{1-b}$ material is a crystal material with a proportion of the element X being b/1 and the element C being (1-b)/1.

A material of the CVD strained diamond layer is a diamond single crystal material.

X is an element germanium or an element silicon, and C is an element carbon.

A numerical value of a is: $1 \geq a \geq 0$.

A numerical value of b is: $1 > b > 0$.

When the substrate layer is made from the silicon single crystal material, the element X is the element silicon; when Z=Z1, a=1; and when Z=Z2, $1 > a > 0$, and a=b; the numerical value of a is decreased gradually when Z changes from Z1 to Z2 in the perpendicular direction of the $X_aC_{1-a}$ gradient buffer layer.

When the substrate layer is made from the diamond single crystal material, the element X is the element silicon or the element germanium; when Z=Z1, a=0; and when Z=Z2, $1 \geq a > 0$, and a=b; the numerical value of a is increased gradually when Z changes from Z1 to Z2 in the perpendicular direction of the $X_aC_{1-a}$ gradient buffer layer.

When the substrate layer is made from the silicon carbide single crystal material, the element X is the element silicon; when Z=Z1, a=0.5; and when Z=Z2, $0.5 > a > 0$ and a=b, the numerical value of a is decreased gradually when Z changes from Z1 to Z2 in the perpendicular direction of the $X_aC_{1-a}$ gradient buffer layer.

With respect to the $X_bC_{1-b}$ relaxation layer, the numerical value of b is constant in the perpendicular direction.

The lattice constant (the lattice constant is set to be A1) of the single crystal material of the $X_bC_{1-b}$ relaxation layer is greater than the diamond lattice constant (the lattice constant is set to be A2) of the CVD strained diamond layer, and a relationship therebetween is: A1>A2 and A1<(1+9%)×A2.

As a preferred embodiment, a thickness of the substrate ranges from 10 μm to 100 mm.

As a preferred embodiment, a thickness of the $X_aC_{1-a}$ gradient buffer layer ranges from 0.001 μm to 10 mm.

As a preferred embodiment, a thickness of the $X_bC_{1-b}$ relaxation layer ranges from 0.001 μm to 10 mm.

As a preferred embodiment, a thickness of the CVD strained diamond layer ranges from 0.001 μm to 10 mm.

As shown in FIG. 1, one of the components of the introduced gas is, but not limited to, a gas containing silicon, for example, silane.

As shown in FIG. 1, one of the components of the introduced gas is, but not limited to, a gas containing germanium, for example, germane.

As shown in FIG. 1, the components of the introduced gas include, but not limited to, methane and hydrogen.

Figure 2:
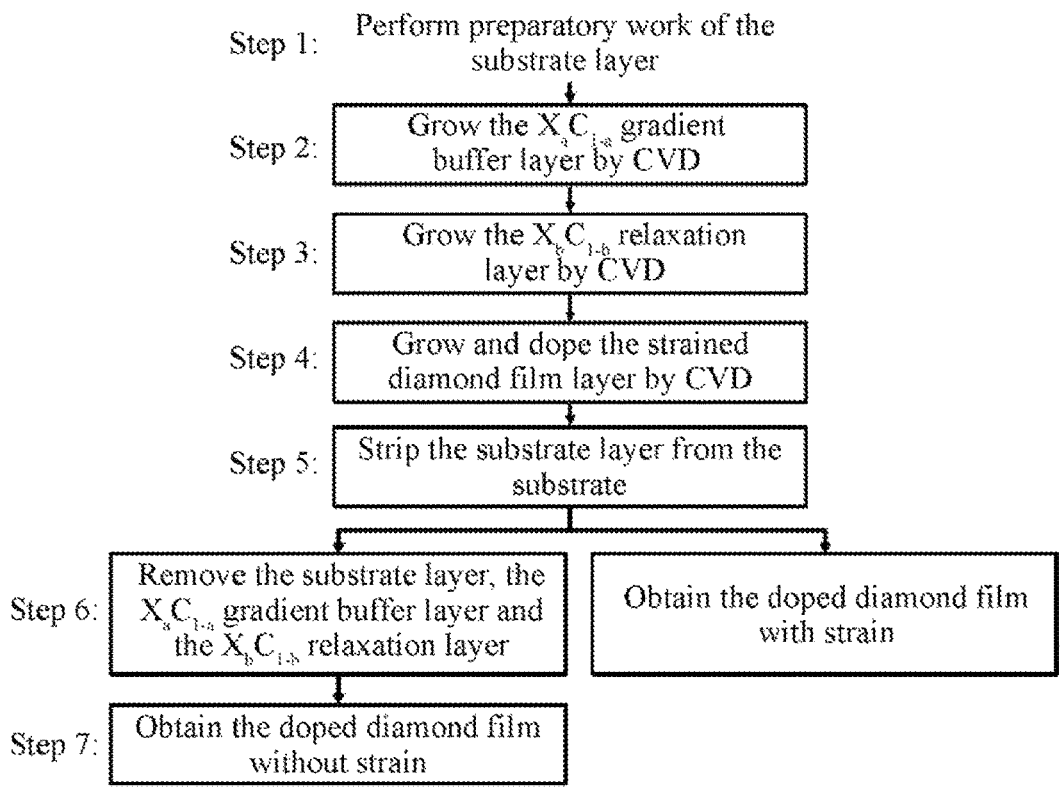
FIG. 2 is a flowchart of growing and doping strained diamond based on a CVD method.

As shown in FIG. 2, the components of the introduced gas in Step 4 include, but not limited to, a doping gas, such as phosphine or hydrogen arsenide or oxygen or hydrogen sulfide.

The doping gas is used for, but not limited to, doping, mainly n-type doping, when the CVD strained diamond layer grows.

Figure 3:
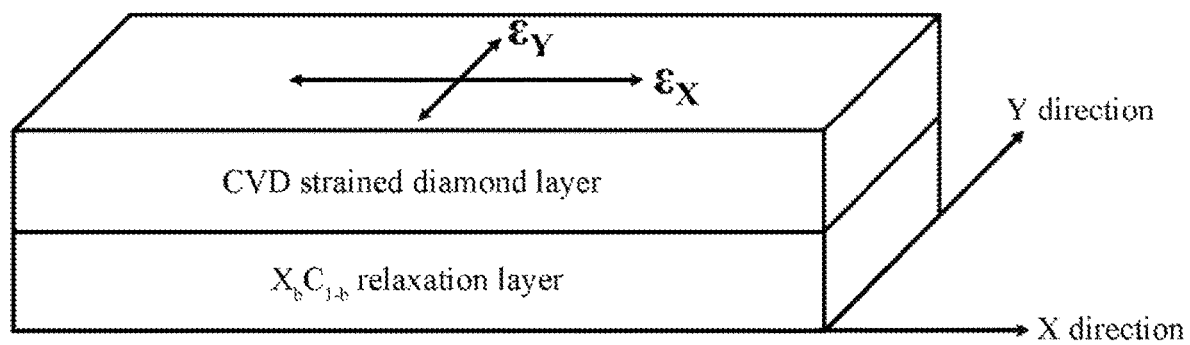
FIG. 3 is a strain schematic diagram of a strained diamond film.

As shown in FIG. 3. the lattice constant of the single crystal material of the $X_bC_{1-b}$ relaxation layer is greater than the diamond lattice constant of the CVD strained diamond layer. When the single crystal material of the $X_bC_{1-b}$ relaxation layer is matched with the lattice constant of the CVD strained diamond layer, the CVD strained diamond layer will be subjected to a stretching strain so as to generate biaxial stretching strains in an X direction and a Y direction.

A thickness of the $X_aC_{1-a}$ gradient buffer layer is greater than a thickness of the $X_bC_{1-b}$ relaxation layer, and the thickness of the $X_bC_{1-b}$ relaxation layer is greater than a thickness of the CVD strained diamond layer, thereby a stretching strain state of the diamond layer is maintained.

A diamond model of 64 atoms is constructed, and based on the first principle, the formation energy for phosphorus doping under each strain condition is calculated. Under a condition that the diamond is strainless, the formation energy of the phosphorus atom is 6.786 eV; when the biaxial stretching strain of the diamond is 4%, the formation energy of the phosphorus atom is 5.827 eV; and when the biaxial stretching strain of the diamond is 8%, the formation energy of the phosphorus atom is 4.842 eV. Thus, it is proved that the biaxial strain helps to reduce the doping formation energy so as to further improve the doping concentration.

The embodiments of the present disclosure provide a method for growing and doping a strained diamond based on a chemical vapor deposition (CVD), including the following steps.

Step 1: Preparatory work of a substrate layer is performed. The substrate layer is placed on a sample stage of a CVD device.

Step 2: An $X_aC_{1-a}$ gradient buffer layer is grown by CVD. A mixed gas of a gas containing an element X, a methane gas and hydrogen is introduced. When the substrate layer is made from a silicon single crystal material, a value of a is decreased gradually with passage of a deposition time, namely, it is to set that the flow of the gas containing the element X is decreased gradually over time. When the substrate layer is made from a diamond single crystal material, the value of a is increased gradually with passage of the deposition time, namely, it is to set that the flow of the gas containing the element X is also increased gradually over time. When X is the element germanium (Ge), then the gas containing the element X refers to a gas containing germanium, and a $Ge_aC_{1-a}$ gradient buffer layer is prepared. When X is the element silicon (Si), then the gas containing the element X refers to a gas containing silicon, and a $Si_aC_{1-a}$ gradient buffer layer is prepared.

As a preferred embodiment, the flow ratio (or a molar ratio) of the introduced methane gas to the introduced hydrogen ranges from 0.1% to 20%.

As a preferred embodiment, the flow ratio (or a molar ratio) of the introduced gas containing the element X to the introduced methane gas is controlled to be about a: (1−a).

As a preferred embodiment, a flow of hydrogen is 1-2000 sccm.

Step 3: An $X_bC_{1-b}$ relaxation layer is grown by CVD. A mixed gas of a gas containing an element X, a methane gas and hydrogen is introduced, and a flow of the gas containing the element X is fixed to make a component X of the $X_bC_{1-b}$ relaxation layer be kept constant in a perpendicular direction. When X is the element germanium (Ge), then the gas containing the element X refers to a gas containing germanium, and a $Ge_aC_{1-a}$ relaxation layer is prepared. When X is the element silicon (Si), then the gas containing the element X refers to a gas containing silicon, and a $Si_aC_{1-a}$ relaxation layer is prepared.

As a preferred embodiment, the flow ratio of the introduced methane gas to the introduced hydrogen ranges from 0.1% to 20%.

As a preferred embodiment, the flow ratio (or a molar ratio) of the introduced gas containing the element X to the introduced methane gas is controlled to be about b: (1−b).

As a preferred embodiment, a flow of hydrogen is 1-2000 sccm.

Step 4: A strained diamond layer is grown and doped by CVD. A mixed gas containing a doping gas, a methane gas and hydrogen is introduced to make the diamond be doped while being grown so as to grow the CVD strained diamond layer on the $X_bC_{1-b}$ relaxation layer.

As a preferred embodiment, a ratio of the introduced methane gas to the introduced hydrogen ranges from 0.1% to 20%.

As a preferred embodiment, the flow ratio (or a molar ratio) of the introduced doping gas to the introduced methane gas ranges from 0.1% to 50%.

As a preferred embodiment, a flow of hydrogen is 1-2000 sccm.

Step 5: The substrate layer is stripped to obtain a diamond-doped epitaxial structure.

Step 6: If it is necessary to recovered the doped diamond to a strainless state, the substrate layer, the $X_aC_{1-a}$ gradient buffer layer and the $X_bC_{1-b}$ relaxation layer are removed by an etching process to obtain a strainless doped diamond.

The foregoing implementations are merely intended to describe the present disclosure rather than to limit the present disclosure. Although detailed descriptions are performed on the present disclosure with reference to embodiments, a person of ordinary skill in the art should understand that various combinations, modifications, or equivalent replacements may be made to the technical solutions of the present disclosure without departing from the spirit and scope of the technical solutions of the present disclosure, which shall fall within the scope of the claims of the present disclosure.

What is claimed is:

1. A method for growing and doping a strained diamond based on a chemical vapor deposition (CVD) method, comprising the following steps:
    Step 1: performing preparatory work of a substrate layer: placing the substrate layer on a sample stage of a CVD device;
    Step 2: growing an $X_aC_{1-a}$ gradient buffer layer by CVD: introducing a mixed gas of a gas containing an element X, a methane gas and hydrogen to prepare the $X_aC_{1-a}$ gradient buffer layer, wherein a is a proportion of the element X in $X_aC_{1-a}$;
    Step 3: growing an $X_bC_{1-b}$ relaxation layer by CVD: introducing a mixed gas of a gas containing an element X, a methane gas and hydrogen, and fixing a flow of the gas containing the element X to make a component X of the $X_bC_{1-b}$ relaxation layer be kept constant in a perpendicular direction so as to prepare the $X_bC_{1-b}$ relaxation layer, wherein b is a proportion of the element X in $X_bC_{1-b}$, X is a lattice constant adjusting element, and C is an element carbon;
    Step 4: growing and doping a CVD strained diamond layer by CVD: introducing a mixed gas containing a doping gas, a methane gas and hydrogen to make the diamond be doped while growing so as to grow the CVD strained diamond layer on the $X_bC_{1-b}$ relaxation layer, wherein a lattice constant of the $X_bC_{1-b}$ relaxation layer is greater than a diamond lattice constant of the CVD strained diamond layer, so that the CVD strained diamond layer is in a stretching strain state; and
    Step 5: stripping the substrate layer to obtain a diamond-doped epitaxial structure.

2. The method for growing and doping a strained diamond based on a CVD method according to claim 1, wherein the element X is an element germanium or silicon.

3. The method for growing and doping a strained diamond based on a CVD method according to claim 1, wherein in Step 2, when the substrate layer is made from a silicon single crystal material, a value of a is decreased gradually with passage of a deposition time, namely, it is to set that the flow of the gas containing the element X is decreased gradually over time; and when the substrate layer is made from a diamond single crystal material, the value of a is increased gradually with passage of the deposition time, namely, it is to set that the flow of the gas containing the element X is increased gradually over time.

4. The method for growing and doping a strained diamond based on a CVD method according to claim 3, wherein the components of the introduced mixed gas in Step 3 are constant in proportion, and a flow ratio of the gas containing the element X to the introduced methane gas is substantially equal to a flow ratio of the gas containing the element X to the introduced methane gas at the end in Step 2.

5. The method for growing and doping a strained diamond based on a CVD method according to claim 3, wherein in each of Step 2 and Step 3, the flow ratio of the introduced methane gases to hydrogen in the introduced mixed gas ranges from 0.1% to 20%.

6. The method for growing and doping a strained diamond based on a CVD method according to claim 3, wherein in each of Step 1, Step 2, Step 3 and the Step 4, the flow of the introduced hydrogen is 1-2000 sccm.

7. The method for growing and doping a strained diamond based on a CVD method according to claim 3, wherein in Step 4, the flow ratio of the introduced doping gas to the introduced methane gas in the introduced mixed gas ranges from 0.1% to 50%.

8. The method for growing and doping a strained diamond based on a CVD method according to claim 1, wherein the doping gas is any one of phosphine, hydrogen arsenide, oxygen and hydrogen sulfide.

9. The method for growing and doping a strained diamond based on a CVD method according to claim 1, wherein a magnitude relationship between a lattice constant A1 of the single crystal material of the $X_bC_{1-b}$ relaxation layer and a diamond lattice constant A2 of the CVD strained diamond layer is: A1>A2 and A1<(1+9%)×A2.

10. The method for growing and doping a strained diamond based on a CVD method according to claim 1, further comprising the following step:
    Step 6: removing the substrate layer, the $X_aC_{1-a}$ gradient buffer layer and the $X_bC_{1-b}$ relaxation layer by an etching process to obtain a strainless doped diamond.

* * * * *